(12) United States Patent
Li et al.

(10) Patent No.: US 11,139,350 B2
(45) Date of Patent: Oct. 5, 2021

(54) DISPLAY PANEL AND MANUFACTURING METHOD THEREOF

(71) Applicant: BOE TECHNOLOGY GROUP CO., LTD., Beijing (CN)

(72) Inventors: Xiaohu Li, Beijing (CN); Zhongyuan Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 16/332,942

(22) PCT Filed: Aug. 16, 2018

(86) PCT No.: PCT/CN2018/100805
§ 371 (c)(1),
(2) Date: Mar. 13, 2019

(87) PCT Pub. No.: WO2019/037652
PCT Pub. Date: Feb. 28, 2019

(65) Prior Publication Data
US 2019/0252474 A1 Aug. 15, 2019

(30) Foreign Application Priority Data
Aug. 24, 2017 (CN) .......................... 201710735774.2

(51) Int. Cl.
*H01L 27/32* (2006.01)
*H01L 51/56* (2006.01)
(Continued)

(52) U.S. Cl.
CPC ...... *H01L 27/3244* (2013.01); *H01L 27/3258* (2013.01); *H01L 51/5256* (2013.01);
(Continued)

(58) Field of Classification Search
CPC ............. H01L 51/5256; H01L 27/3244; H01L 27/3258; H01L 51/56; H01L 51/0045;
(Continued)

(56) References Cited

U.S. PATENT DOCUMENTS 9,362,467 B2  6/2016 Choi et al.
2009/0103010 A1* 4/2009 Okamoto .......... G02F 1/133351
349/73
(Continued)

FOREIGN PATENT DOCUMENTS

CN   103325337 A   9/2013
CN   106328680 A   1/2017
(Continued)

OTHER PUBLICATIONS

International Search Report dated Oct. 25, 2018 issued in corresponding International Application No. PCT/CN2018/100805.

*Primary Examiner* — Mouloucoulaye Inoussa
(74) *Attorney, Agent, or Firm* — Nath, Goldberg & Meyer; Joshua B. Goldberg

(57) ABSTRACT

The present application provides a display panel and a manufacturing method thereof. In the method for manufacturing a display panel according to the present application, a half-cutting protective strip is provided on the driving circuit functional layer in the half-cutting area, so that the heat will not be conducted to the driving circuit functional layer under the half-cutting protective strip during cutting the layer to be cut by the laser along the half-cutting line, thereby effectively avoiding damage to the driving circuit functional layer, and thus improving the production yield.

15 Claims, 4 Drawing Sheets

(51) Int. Cl.
*H01L 51/52* (2006.01)
*H01L 51/00* (2006.01)

(52) U.S. Cl.
CPC .......... *H01L 51/56* (2013.01); *H01L 51/0045* (2013.01); *H01L 2251/566* (2013.01)

(58) Field of Classification Search
CPC ............... H01L 27/3272; H01L 27/322; H01L 51/5259; H01L 51/5237; G02B 6/0016; G02B 6/0088; G02B 6/005; G02B 6/0055; G02B 6/0043; G02F 1/133528; G02F 1/1336; G02F 1/133512; G02F 1/136204; G02F 1/13338; G02F 1/1333; G02F 1/1339

USPC ....... 257/40; 438/27, 28; 349/153, 110, 123, 349/139, 73, 187, 12, 111

See application file for complete search history.

(56) References Cited

U.S. PATENT DOCUMENTS

| | | | |
|---|---|---|---|
| 2009/0322979 A1* | 12/2009 | Kang | G02F 1/1333 349/58 |
| 2010/0195039 A1* | 8/2010 | Park | B23K 26/40 349/152 |
| 2012/0099056 A1* | 4/2012 | Lee | B23K 26/18 349/106 |
| 2015/0179725 A1* | 6/2015 | Kuji | H01L 51/5259 257/40 |
| 2015/0185942 A1* | 7/2015 | Kim | G06F 3/0445 345/173 |
| 2015/0380474 A1* | 12/2015 | Lee | H01L 51/5262 257/40 |
| 2016/0341870 A1* | 11/2016 | Xie | G02B 6/0016 |
| 2018/0151833 A1* | 5/2018 | Riegel | H01L 51/5253 |
| 2018/0299958 A1* | 10/2018 | Wang | G06F 3/01 |
| 2019/0245017 A1* | 8/2019 | Jeon | H01L 27/323 |

FOREIGN PATENT DOCUMENTS

| | | |
|---|---|---|
| CN | 107482045 A | 12/2017 |
| CN | 207068857 U | 3/2018 |
| JP | 2007250620 A | 9/2007 |

* cited by examiner

DISPLAY PANEL AND MANUFACTURING METHOD THEREOF

CROSS-REFERENCE TO RELATED APPLICATION

The present disclosure claims priority to Chinese Patent Application No. 201710735774.2 filed on Aug. 24, 2017, the disclosure of which is hereby incorporated by reference in its entirety.

TECHNICAL FIELD

The present disclosure relates to the field of display technology, in particular, to a display panel and a manufacturing method thereof.

BACKGROUND

In the manufacturing process of Organic Light-Emitting Diode (OLED) devices, in order to achieve a large-scale mass production, a large number of display panels are formed on a large piece of mother glass, then the mother board is cut into a plurality of display panels, and such cutting is known as "full cutting". On the other hand, in order to separate the display area from the bezel area in each display panel to facilitate wiring in the bezel area, it is necessary to cut and remove part of the structural layers in the bezel area, but the lower layers in the bezel area such as the conductive metal layer, the substrate, etc. need not be cut, and such cutting is known as "half cutting".

For an existing flexible OLED device, it is necessary to remove a film layer on the connection area for connecting a circuit chip on a flexible display substrate so as to connect the flexible display substrate to the circuit chip. The removing process is generally performed by a laser half cutting process.

SUMMARY

An aspect of the present application provides a method for manufacturing an OLED display panel, the display panel being divided into a display area, a half-cutting area and a bezel area, the method including steps of:

forming a driving circuit functional layer on a base substrate;

forming a plurality of structural layers on the driving circuit functional layer in the display area;

forming, at a position on the driving circuit functional layer corresponding to the half-cutting area, a half-cutting protective strip for protecting the driving circuit functional layer thereunder during half cutting;

forming a layer to be cut throughout the display area, the half-cutting area and the bezel area continuously such that a portion of the layer to be cut in the display area is located on the plurality of the structural layers, a portion of the layer to be cut in the half-cutting area is located on the half-cutting protective strip, and a portion of the layer to be cut in the bezel area is located on the driving circuit functional layer.

In an embodiment, the method further includes cutting the layer to be cut by a laser.

In an embodiment, the layer to be cut includes at least one of a temporary protection film, a polarizer layer and a touch screen.

In an embodiment, forming the half-cutting protective strip includes forming the half-cutting protective strip at an edge position of the structural layers on the driving circuit functional layer.

In an embodiment, the plurality of the structural layers includes a light emitting functional layer and an encapsulation layer on the light emitting functional layer, and at least the encapsulation layer among the plurality of the structural layers extends into the half-cutting area to be on the driving circuit functional layer, and forming the half-cutting protective strip includes forming the half-cutting protective strip on the encapsulation layer.

In an embodiment, the half-cutting protective strip is formed by a thermal conductive material.

In an embodiment, forming the half-cutting protective strip by a thermal conductive material includes forming the half-cutting protective strip by graphite.

In an embodiment, the half-cutting protective strip further includes insulating adhesive, and forming the half-cutting protective strip includes sticking the graphite onto the driving circuit functional layer using the insulating adhesive.

In an embodiment, the half-cutting protective strip is formed by a graphite printing method.

In an embodiment, the half-cutting protective strip is formed to have a thickness of 10 μm to 100 μm in a direction perpendicular to the display panel.

In an embodiment, the half-cutting protective strip is formed to have a width of 0.1 mm to 2 mm.

In an embodiment, the half-cutting area is provided at a position in the bezel area adjacent to the display area.

In an embodiment, the display panel includes an OLED display panel.

Another aspect of the present application provides a display panel divided into a display area, a half-cutting area and a bezel area, and the display panel including:

a driving circuit functional layer located on a base substrate;

a plurality of structural layers located on the driving circuit functional layer in the display area;

a half-cutting protective strip located at a position on the driving circuit functional layer corresponding to the half-cutting area, and configured to protect the driving circuit functional layer under the half-cutting protective strip during half cutting; and a layer to be cut continuously provided in the display area, the half-cutting area and the bezel area, and a portion of the layer to be cut in the display area is located on the plurality of the structural layers, a portion of the layer to be cut in the half-cutting area is located on the half-cutting protective strip, and a portion of the layer to be cut in the bezel area is located on the driving circuit functional layer.

In an embodiment, the half-cutting protective strip is provided at an edge position of the structural layers on the driving circuit functional layer.

In an embodiment, the structural layers includes a light emitting functional layer and an encapsulation layer on the light emitting functional layer, and at least the encapsulation layer among the plurality of the structural layers extends into the half-cutting area to be on the driving circuit functional layer, and the half-cutting protective strip is provided on the encapsulation layer.

In an embodiment, the half-cutting protective strip is made of a thermal conductive material.

In an embodiment, the thermal conductive material includes graphite.

In an embodiment, the half-cutting protective strip has a thickness of 10 μm to 100 μm in a direction perpendicular to the display panel.

In an embodiment, the half-cutting protective strip has a width of 0.1 mm to 2 mm.

DETAILED DESCRIPTION

The applicant has found that at least the following problems exist in the related art: in the case of using a laser for a half-cutting process performed on a flexible OLED device, it is easy to damage a driving circuit functional layer made of a conductive metal under a layer to be cut such as a temporary protection film during the cutting process.

In the method for manufacturing a display panel according to the present application, a half-cutting protective strip is provided on the driving circuit functional layer in the half-cutting area, so that heat will not be conducted to the driving circuit functional layer under the half-cutting protective strip when cutting the layer to be cut by the laser along a half-cutting line, thereby effectively avoiding the damage to the driving circuit functional layer, and improving the production yield.

The present application will be further described in detail below in conjunction with specific implementations and the drawings in order that those skilled in the art can understand the technical solutions of the present application better.

Figure 1:
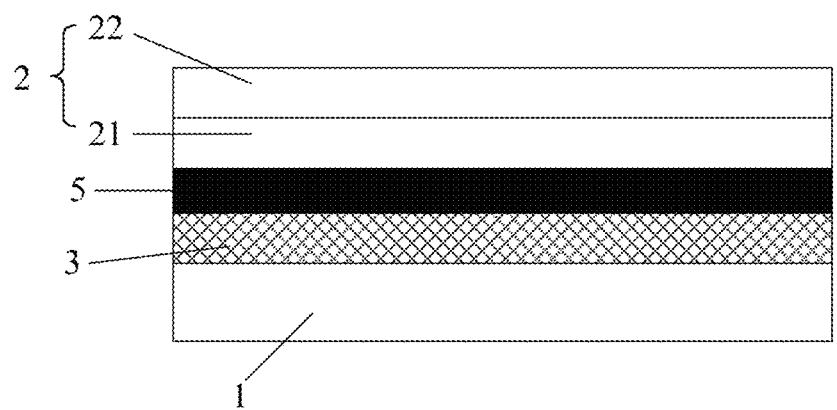
FIGS. 1 to 3 are schematic structural diagrams of display panels according to embodiments of the present application.

FIG. 1 shows a structure of a display panel in a half-cutting area according to an embodiment of the present application. As shown in FIG. 1, in the half-cutting area according to the embodiment, the display panel includes a driving circuit functional layer 3 provided on the base substrate 1 and a plurality of structural layers 2 on the driving circuit functional layers 3. The structural layers 2 include a light emitting functional layer 21 and an encapsulation layer 22 on the light emitting functional layer 21. A half-cutting protective strip 5 is provided between the driving circuit functional layer 3 and the light emitting functional layer 21 so as to protect the driving circuit functional layer 3 under the half-cutting protective strip 5 during half cutting using a laser. The structures in the display area and the bezel area in the embodiment are the same as those described with reference to FIG. 2, and thus the same description is omitted here.

It is noted that, in the present application, the half-cutting area refers to an area where an upper layer of the display panel needs to be cut while a lower layer thereof does not need to be cut. For example, it may be a connection area, which is used for connecting a circuit chip, of an OLED display panel.

In the display panel according to the embodiment, the half-cutting protective strip 5 is provided on the driving circuit functional layer in the half-cutting area, so that the heat will not be conducted to the driving circuit functional layer 3 under the half-cutting protective strip 5 during the cutting along the half-cutting line using the laser, thereby effectively avoiding the damage to the driving circuit functional layer 3, and thus improving the production yield. The method for manufacturing the display panel according to the embodiment solves the problem that the underlying metal cannot be bound or is damaged due to an undesirable cutting by the laser along the half-cutting line.

Figure 2:
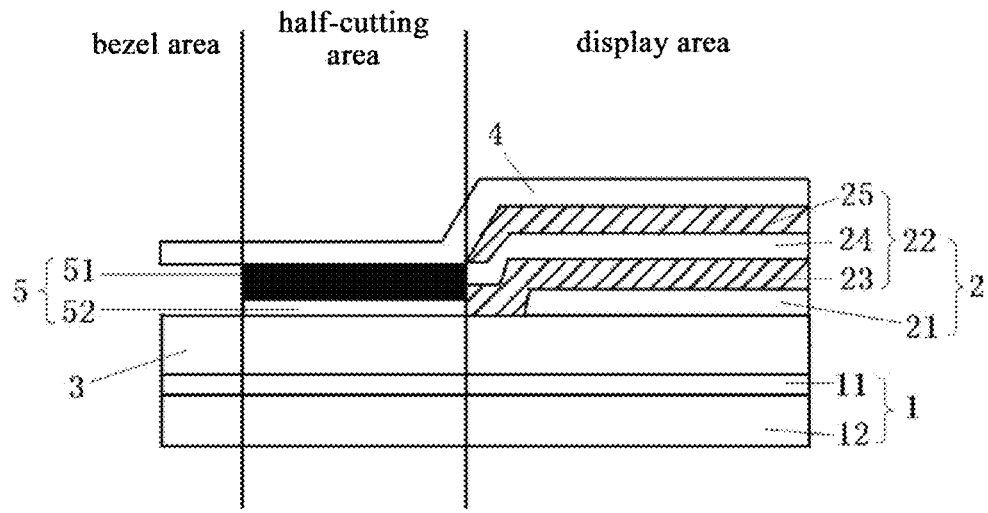

FIG. 2 shows a structure of a display panel according to another embodiment of the present application. As shown in FIG. 2, the display panel may be divided into a bezel area, a half-cutting area and a display area. A driving circuit functional layer 3 is provided on the base substrate, a plurality of structural layers 2 are located on the driving circuit functional layer 3 in the display area, and a half-cutting protective strip 5 is located at a position on the driving circuit functional layer 3 corresponding to the half-cutting area. Similar to the embodiment in FIG. 1, the structural layers 2 includes a light emitting functional layer 21 and an encapsulation layer 22 on the light emitting functional layer 21, and the encapsulation layer 22 specifically includes a first inorganic layer 23, a second inorganic layer 25 and an organic resin layer 24 between the two inorganic layers. A temporary protection film 4 is continuous in the display area, the half-cutting area and the bezel area, and a portion of the temporary protection film 4 in the display area is located on the plurality of the structural layers 2, a portion of the temporary protection film 4 in the half-cutting area is located on the half-cutting protective strip 5, and a portion of the temporary protection film 4 in the bezel area is located on the driving circuit functional layer 3.

The present embodiment differs from the embodiment shown in FIG. 1 in that, the structural layers 2 in the display area do not extend to be on the half-cutting protective strip 5 in the half-cutting area. In the present embodiment, the half-cutting protective strip 5 is provided at an edge position of the light emitting functional layer 21 on the driving circuit functional layer 3.

Figure 3:
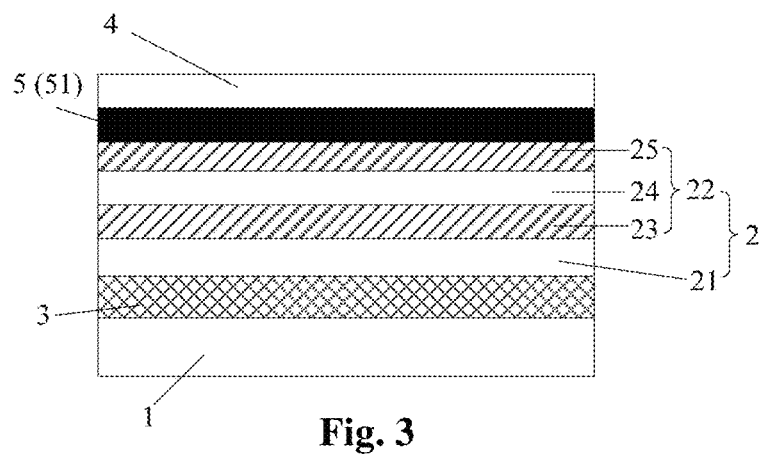

FIG. 3 shows a structure of a display panel in the half-cutting area according to another embodiment of the present application. The structures in the display area and in the bezel area in this embodiment are the same as those described above with reference to FIG. 2, and the same descriptions are omitted here. As shown in FIG. 3, in the half-cutting area according to the present embodiment, the encapsulation layer 22 and the light emitting functional layer 21 of the structural layers 2 extend into the half-cutting area to be located on the driving circuit functional layer, that is, the half-cutting protective strip 5 is formed on the encapsulation layer 22, so as to protect the driving circuit functional layer 3 thereunder.

It is to be noted that, the layer to be cut in the present application refers to a layer which is cut during cutting. The temporary protection film 4 shown in FIG. 2 or 3 is an example of the layer to be cut in the half-cutting area, the display area and the bezel area. In these examples, a portion of the temporary protection film 4 in the half-cutting area needs to be cut while the structures below the temporary protection film 4 (below the half-cutting protective strip 5) need to be protected. It will be appreciated that the case in which the polarizer layer or the touch screen is used as the layer to be cut is similar to these examples, and will not be repeated here.

Figure 4:
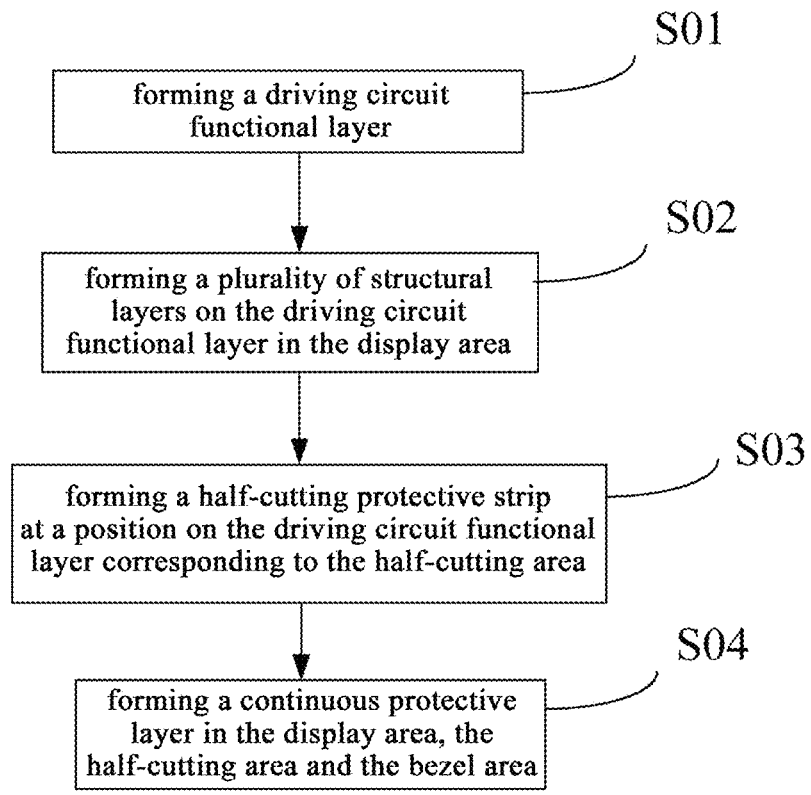
FIG. 4 is a flowchart of a method for manufacturing an OLED display panel according to an embodiment of the present application.
Figure 5:
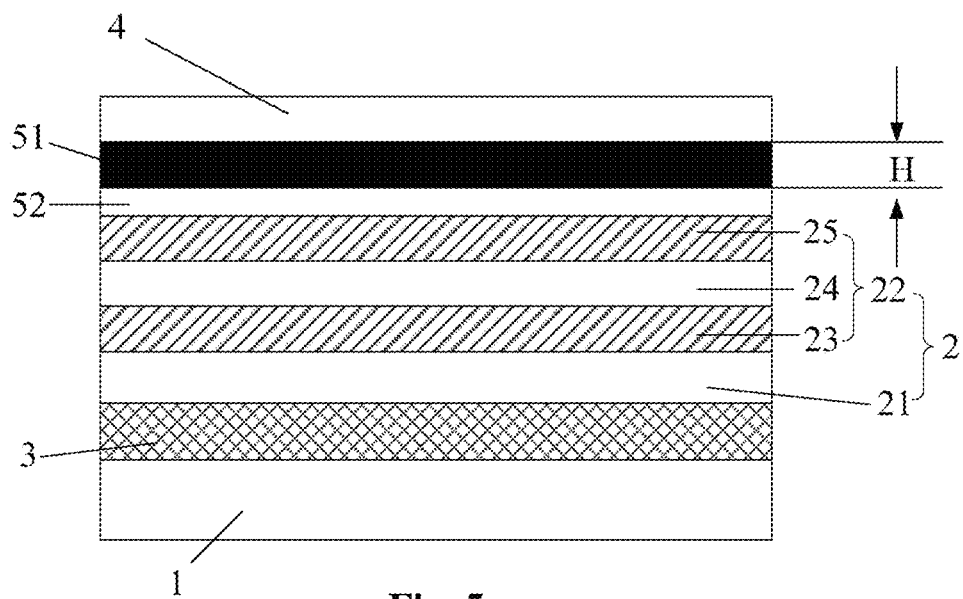
FIGS. 5 to 7 are schematic structural diagrams of OLED display panels manufactured by the method according to an embodiment of the present application.

In another aspect, the present application provides a method for manufacturing an OLED display panel, the display panel being divided into a display area, a half-cutting area and a bezel area. As shown in FIG. 4, the method includes steps of:

S01: forming a driving circuit functional layer on a base substrate, the base substrate being made of a flexible material or glass;

S02: forming a plurality of structural layers on the driving circuit functional layer in the display area;

S03: forming, at a position on the driving circuit functional layer corresponding to the half-cutting area, a half-cutting protective strip for protecting the driving circuit functional layer thereunder during half cutting; and S04: forming a continuous layer to be cut throughout the display area, the half-cutting area and the bezel area such that a portion of the layer to be cut in the display area is located on the plurality of structural layers, a portion of the layer to be cut in the half-cutting area is located on the half-cutting protective strip, and a portion of the layer to be cut in the bezel area is located on the driving circuit functional layer.

In the method for manufacturing an OLED display panel according to the present embodiment, a half-cutting protective strip is provided on the driving circuit functional layer in the half-cutting area, so that the heat will not be conducted to the driving circuit functional layer under the half-cutting protective strip during the cutting along the half-cutting line by using the laser, thereby avoiding the damage to the driving circuit functional layer, and thus improving the production yield. The method for manufacturing the display panel according to the embodiment solves the problem that the underlying metal cannot be bound or is damaged due to an undesirable cutting by the laser along the half-cutting line.

The method for manufacturing an OLED display panel shown in FIG. 4 will be described in detail below with reference to FIGS. 2 to 7. As described above, the display panel may be divided into a display area, a half-cutting area and a bezel area.

In step S01 of FIG. 4, the driving circuit functional layer 3 is formed on the base substrate 1 made of a flexible material or glass 12.

That is to say, the base substrate 1 may be made of a flexible material, or may be made of glass 12. In the embodiment illustrated in FIG. 2, the base substrate 1 is made of glass 12, and in this case, a flexible substrate 11 made of a flexible material such as polyimide (PI) needs to be formed on the glass 12 at first.

In step S02 of FIG. 4, a plurality of structural layers 2 are formed on the driving circuit functional layer 3 in the display area.

In this embodiment, the step of forming a plurality of structural layers 2 includes the following steps.

In step S02a, a light emitting functional layer 21 is formed. Specifically, the light emitting functional layer 21 includes a hole injection layer (HIL), a hole transport layer (HTL), an emitting material layer (EML), an electron transport layer (ETL) and an electron injection layer (EIL).

In step S02b, an encapsulation layer 22 is formed. The encapsulation layer 22 includes two layers, namely, a first inorganic layer 23 and a second inorganic layer 25, formed by chemical vapor deposition (CVD) and an organic resin layer 24 sandwiched between the two inorganic layers and coated and cured by inkjet printing. The inorganic layers formed by CVD are insulation layers which are not electrically conductive.

In step S03 of FIG. 4, a half-cutting protective strip 5 is formed at a position on the driving circuit functional layer 3 corresponding to the half-cutting area, so as to protect the driving circuit functional layer 3 under the half-cutting protective strip 5 during the half cutting by a laser.

It should be noted that, the structure in the half-cutting area and the structure under the half-cutting protective strip 5 vary depending on the process.

In an embodiment, the step of forming the half-cutting protective strip 5 includes forming the half-cutting protective strip 5 at an edge position of the structural layers on the driving circuit functional layer 3, as shown in FIG. 2. In this embodiment, the half-cutting protective strip 5 may be used for protecting the driving circuit functional layer 3 thereunder.

In another embodiment, at least the encapsulation layer of the plurality of structural layers extends onto the driving circuit functional layer in the half-cutting area. In this embodiment, the step of forming the half-cutting protective strip includes forming the half-cutting protective strip on the encapsulation layer.

In the embodiment shown in FIG. 3, among the plurality of structural layers 2, both the light emitting functional layer 21 and the encapsulation layer 22 on the light emitting functional layer 21 extend onto the driving circuit functional layer in the half-cutting area, i.e., the half-cutting protective strip 5 is formed on the encapsulation layer 22. In this embodiment, the half-cutting protective strip 5 may be used for protecting the driving circuit functional layer 3 thereunder.

In an embodiment, the half-cutting protective strip 5 is made of a thermal conductive material. In an embodiment, the thermal conductive material is graphite 51, as shown in FIG. 2.

In the embodiment, since graphite 51 has good thermal conductivity, the heat will not be conducted to the film structure(s) under the half-cutting protective strip when cutting the half-cutting protective strip made of graphite 51 by a laser along the half-cutting line, thereby effectively avoiding the damage to the underlying structure(s), and thus improving the production yield. In other embodiments, other materials having good thermal conductivity may be used to replace graphite 51.

In an embodiment, as shown in FIG. 2, the half-cutting protective strip 5 may further include insulating adhesive 52. The step of forming the half-cutting protective strip 5 includes sticking the graphite 51 onto the driving circuit functional layer 3 using the insulating adhesive 52. In this embodiment, since the insulating adhesive 52 is under the graphite 51, the half-cutting protective strip 5 is not electrically connected to the driving circuit functional layer 3 thereunder. The graphite 51 simply functions to prevent the underlying metal wires from being damaged by too large energy during the half-cutting.

In another embodiment, as shown in FIG. 3, an inorganic layer formed by using CVD is under the graphite 51. The inorganic layer is an insulation layer which is not electrically conductive, and thus there is no need to provide the insulating adhesive 52. In this case, the half-cutting protective strip 5 may be formed by a graphite printing method. Specifically, graphite may be printed to the specified position by the printing method; alternatively, a mask having a desired pattern may be placed on the position where the half-cutting protective strip 5 is to be formed, and then spray graphite onto the mask to form the half-cutting protective strip 5 having a shape of the corresponding pattern.

In an embodiment, the half-cutting protective strip 5 has a dimension of 10 µm to 100 µm in a direction perpendicular to the OLED display panel. That is to say, the thicknesses H of the half-cutting protective strips 5 in FIGS. 2 to 4 are 10 µm to 100 µm.

Figure 6:
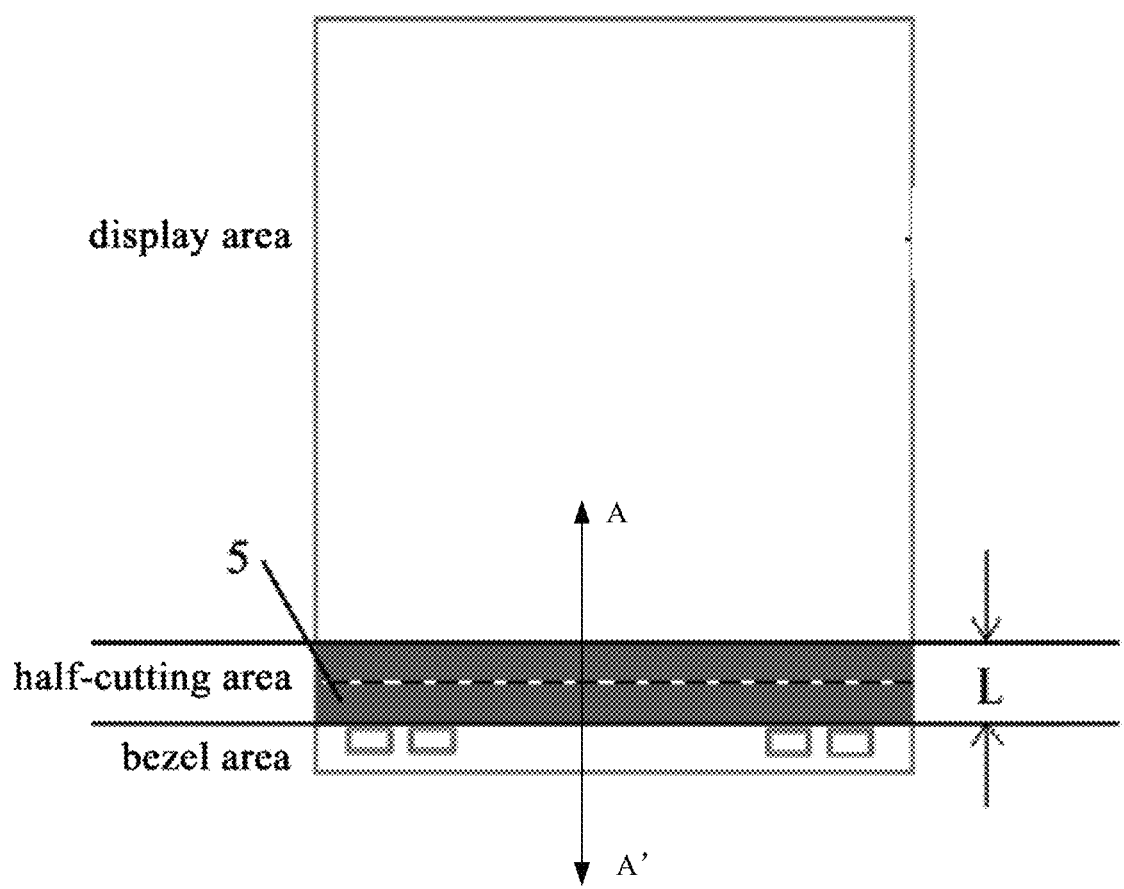
Figure 7:
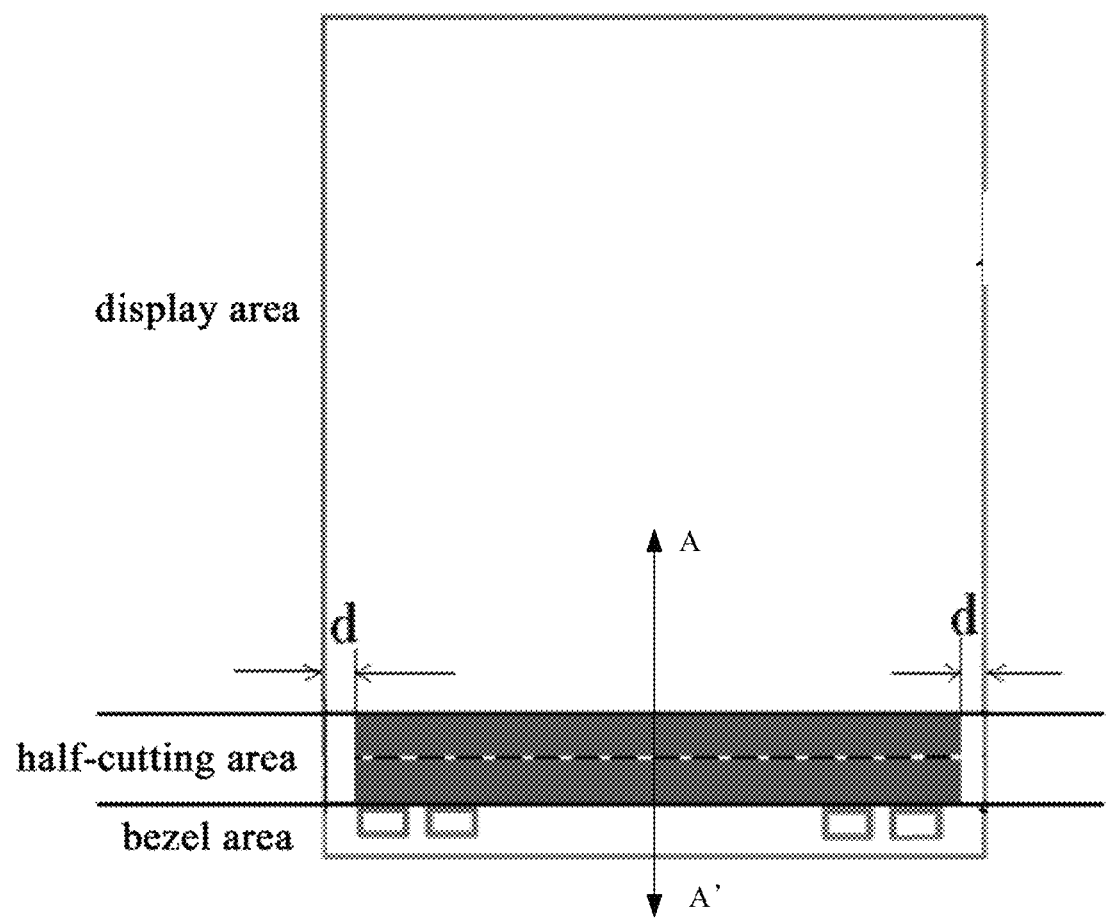

FIGS. 6 and 7 show the top views of the display panels according to the present application, and the black and white doted lines are the cutting lines. FIG. 2 shows a cross-sectional view of the structure of the display panel taken along the line AA' shown in FIGS. 6 and 7. In the embodiment illustrated in FIG. 6, the OLED display panel includes the display area, the bezel area and the half-cutting area. The half-cutting area is provided at a position in the bezel area adjacent to the display area. The width L of the half-cutting protective strip 5 is 0.1 mm to 2 mm. In another embodiment, as shown in FIG. 7, the distance d from the half-cutting protective strip 5 to the boundary of the OLED display panel is 1 mm to 5 mm, which will not affect the laser cutting process.

In step S04 shown in FIG. 4, the continuous layer to be cut is formed in the display area, the half-cutting area and the bezel area such that a portion of the layer to be cut in the display area is located on the plurality of the structural layers, a portion of the layer to be cut in the half-cutting area is located on the half-cutting protective strip, and a portion of the layer to be cut in the bezel area is located on the driving circuit functional layer. Specifically, when performing cutting by a laser, the laser power ranges from 1 w to 60 w.

It will be appreciated that various modifications may be made to the specific implementations of the above embodiments. For example, the size, thickness, etc., of each structural layer may be adjusted as needed, and the material of each structural layer may also be changed as needed.

Another embodiment of the present application provides a display device including any of the above OLED display panels. The display device may be any product or component having a display function, such as an electronic paper, a mobile phone, a tablet computer, a television, a display, a laptop, a digital photo frame, a navigator, etc.

It could be understood that the above implementations are only exemplary implementations for illustrating the principle of the present application. However, the present application is not limited thereto. An ordinary person skilled in the art can make various modifications and improvements without departing from the essence of the present application, and these modifications and improvements should be also considered as falling into the protective scope of the present application.

What is claimed is:

1. A method for manufacturing a display panel, wherein the display panel is divided into a display area, a half-cutting area and a bezel area, the half-cutting are being between the display area and the bezel area, and comprises a base substrate, a driving circuit functional layer on the base substrate, and a plurality of structural layers on the driving circuit functional layer in the display area, wherein the structural layers comprise a light emitting functional layer, the method comprises steps of:

forming, at a position on the driving circuit functional layer corresponding to the half-cutting area, a half-cutting protective strip for protecting the driving circuit functional layer there, under during half cutting; and forming a continuous layer to be cut in the display area, the half-cutting area and the bezel area such that a portion of the continuous layer to be cut in the display area is located on the plurality of the structural layers, a portion of the continuous layer to be cut in the half-cutting area is located on the half-cutting protective strip, and a portion of the layer to be cut in the bezel area is located on the driving circuit functional layer, wherein the plurality of the structural layers further comprises an encapsulation layer, which comprises a first inorganic layer and a second inorganic layer, and an organic resin layer sandwiched between the first inorganic layer and the second inorganic layer, on the light emitting functional layer, and the encapsulation layer of the plurality of the structural layers extends into the half-cutting area to be on and in direct contact with the driving circuit functional layer, and forming the half-cutting protective strip comprises forming the half-cutting protective strip on the second inorganic layer to be in direct contact with the second inorganic layer such that the half-cutting protective strip is made of a thermal conductive material, the thermal conductive material comprises graphite, and the half-cutting protective strip is sticking to the second inorganic layer with an insulating adhesive therebetween.

2. The method of claim 1, further comprising a step of cutting the continuous layer to be cut by a laser.

3. The method of claim 1, wherein the continuous layer to be cut comprises at least one of a temporary protection film, a polarizer layer and a touch screen.

4. The method of claim 1, wherein forming the half-cutting protective strip comprises forming the half-cutting protective strip at an edge position of the structural layers on the driving circuit functional layer to be in direct contact with the driving circuit functional layer.

5. The method of claim 1, wherein the half-cutting protective strip is formed by a graphite printing method.

6. The method of claim 1, wherein the half-cutting protective strip is formed to have a thickness of 10 µm to 100 µm in a direction perpendicular to the display panel.

7. The method of claim 1, wherein the half-cutting protective strip is formed to have a width of 0.1 mm to 2 mm.

8. The method of claim 1, wherein the half-cutting area is provided at a position in the bezel area adjacent to the display area.

9. The method of claim 1, wherein the display panel comprises an OLED display panel.

10. A display panel, being divided into a display area, a half-cutting area and a bezel area, the half-cutting area being between the display area and the bezel area, and comprising:

a driving circuit functional layer located on a base substrate in the display area, the half-cutting area and the bezel area;

a plurality of structural layers located on the driving circuit functional layer in the display area, the half-cutting area and the bezel area;

a half-cutting protective strip directly on the plurality of the structural layers at a position corresponding to the half-cutting area and configured to protect the driving circuit functional layer under the half-cutting protective strip during half cutting, wherein the structural layers comprise a light emitting functional layer, which comprises a hole injection layer, a hole transport layer, an emitting material layer, an electron transport layer and an electron injection layer;

the structural layers further comprise an encapsulation layer on the light emitting functional layer, and the encapsulation layer of the plurality of the structural layers extends into the half-cutting area to be on and in direct contact with the driving circuit functional layer, and the half-cutting protective strip is provided on and in direct contact with the encapsulation layer; and the encapsulation layer comprises a first inorganic layer and a second inorganic layer, and an organic resin layer sandwiched between the first inorganic layer and the second inorganic layer, and the half-cutting protective strip is formed on the second inorganic layer to be in direct contact with the second inorganic layer, wherein the half-cutting protective strip is made of a thermal conductive material; the thermal conductive material comprises graphite, and the half-cutting protective strip is sticking to the second inorganic layer with an insulating adhesive therebetween.

11. A display panel, being divided into a display area, and half-cutting area and a bezel area, the half-cutting area being between the display area and the bezel area, and comprising;
- a driving circuit functional layer located on a base substrate in the display area, the half-cutting area and the bezel area;
- a plurality of structural layers located on the driving circuit functional layer only in the display area;
- a half-cutting protective strip directly on the driving circuit function layer at a position corresponding to the half-cutting area and configured to protect the driving circuit functional layer under the half-cutting strip during half-cutting,
- wherein the structural layers comprise a light emitting functional layer, wherein the half-cutting protective strip is provided at an edge position of the structural layers on the driving circuit functional layer to be in direct contact with the driving circuit functional layer, and
- wherein the half-cutting protective strip is made of a thermal conductive material, the thermal conductive material comprises graphite, and the half-cutting protective strip is sticking to the second inorganic layer with an insulating adhesive therebetween.

12. The display panel of claim 11, wherein the half-cutting protective strip has a thickness of 10 µm to 100 µm in a direction perpendicular to the display panel.

13. The display panel of claim 10, wherein the half-cutting protective strip has a width of 0.1 mm to 2 mm.

14. The display panel of claim 11, wherein the half-cutting protective strip has a thickness of 10 µm to 100 µm in a direction perpendicular to the display panel.

15. The display panel of claim 14, wherein the half-cutting protective strip has a width of 0.1 mm to 2 mm.

* * * * *